United States Patent
Foncellino et al.

(10) Patent No.: US 10,576,500 B2
(45) Date of Patent: Mar. 3, 2020

(54) PIEZOELECTRIC MICRO-MACHINED ULTRASONIC TRANSDUCER (PMUT) AND METHOD FOR MANUFACTURING THE PMUT

(71) Applicant: STMICROELECTRONICS S.R.L., Agrate Brianza (IT)

(72) Inventors: Francesco Foncellino, Caserta (IT); Flavio Francesco Villa, Milan (IT); Andrea Di Matteo, Naples (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 337 days.

(21) Appl. No.: 15/626,824

(22) Filed: Jun. 19, 2017

(65) Prior Publication Data

US 2018/0178251 A1 Jun. 28, 2018

(30) Foreign Application Priority Data

Dec. 28, 2016 (IT) .......................... 102016000131844

(51) Int. Cl.
*H01L 41/09* (2006.01)
*H01L 41/29* (2013.01)
(Continued)

(52) U.S. Cl.
CPC .......... *B06B 1/0622* (2013.01); *B06B 1/0207* (2013.01); *H01L 41/1138* (2013.01); *H01L 41/293* (2013.01); *H01L 41/332* (2013.01)

(58) Field of Classification Search
CPC . B06B 1/0622; B06B 1/0207; H01L 41/1138; H01L 41/293; H01L 41/332
(Continued)

(56) References Cited

U.S. PATENT DOCUMENTS 6,870,445 B2 * 3/2005 Kawakubo ............... H03H 3/04
310/324
7,227,429 B2 6/2007 Kawachi et al.
(Continued)

FOREIGN PATENT DOCUMENTS

CN 1534869 A 10/2004
CN 1632546 A 6/2005
(Continued)

OTHER PUBLICATIONS

Huang et al., "Capacitive Micromachined Ultrasonic Transducers with Piston-Shaped Membranes: Fabrication and Experimental Characterization," *IEEE Transactions on Ultrasonics, Ferroelectrics, and Frequency Control* 56(1):136-145, 2009.
(Continued)

*Primary Examiner* — Thomas M Dougherty
(74) *Attorney, Agent, or Firm* — Seed Intellectual Property Law Group LLP

(57) ABSTRACT

A piezoelectric micro-machined ultrasonic transducer (PMUT) comprising: a semiconductor body having a first cavity and a membrane, which is suspended over the first cavity and faces a front side of the semiconductor body; and a piezoelectric transducer assembly extending at least in part on the membrane, which may be actuated for generating a deflection of the membrane. A second cavity extends buried in a peripheral region of the membrane and delimits a central region of the membrane. Moreover, the peripheral portion has a stiffness lower than the stiffness of the central portion.

23 Claims, 7 Drawing Sheets

(51) Int. Cl.
*B06B 1/06* (2006.01)
*B06B 1/02* (2006.01)
*H01L 41/113* (2006.01)
*H01L 41/293* (2013.01)
*H01L 41/332* (2013.01)

(58) Field of Classification Search
USPC .................................... 310/322, 324, 334
See application file for complete search history.

(56) References Cited

U.S. PATENT DOCUMENTS

| | | | |
|---|---|---|---|
| 2008/0013405 A1 | 1/2008 | Moon et al. | |
| 2008/0224242 A1 | 9/2008 | Villa et al. | |
| 2010/0170324 A1* | 7/2010 | Mastromatteo | G01G 3/13 73/24.06 |
| 2015/0265245 A1 | 9/2015 | von Ramm et al. | |
| 2017/0186940 A1* | 6/2017 | Bevilacqua | H01L 41/053 |
| 2019/0259932 A1* | 8/2019 | Procopio | B06B 1/06 |

FOREIGN PATENT DOCUMENTS

| | | |
|---|---|---|
| JP | H08201569 A | 8/1996 |
| WO | 2009096576 A2 | 8/2009 |
| WO | 2011078218 A1 | 6/2011 |

OTHER PUBLICATIONS

Lu et al., "A High Fill-Factor Annular Array of High Frequency Piezoelectric Micromachined Ultrasonic Transducers," *Journal of Microelectromechanical Systems* 24(4):904-913, 2015.

Lu et al., "High Frequency and High Fill Factor Piezoelectric Micromachined Ultrasonic Transducers Based on Cavity SOI Wafers," *Solid-State Sensors, Actuators and Microsystems Workshop*, Hilton Head Island, South Carolina, Jun. 8-12, 2014, pp. 131-134.

Qiu et al., "Piezoelectric Micromachined Ultrasound Transducer (PMUT) Arrays for Integrated Sensing, Actuation and Imaging," *Sensors* 15:8020-8041, 2015.

Sato et al., "A New Substrate Engineering for the Formation of Empty Space in Silicon (ESS) Induced by Silicon Surface Migration," *IEDM*, 1999, pp. 517-520.

Wang et al., "A Piezoelectric Micromachined Ultrasonic Transducer Using Piston-Like Membrane Motion," *IEEE Electron Device Letters* 36(9):957-959, 2015.

Yamashita et al., "Arrayed ultrasonic microsensors with high directivity for in-air use using PZT thin film on silicon diaphragms," *Sensors and Actuators A* 97-98:302-307, 2002.

Yang et al., "An Ultra-High Element Density pMUT Array with Low Crosstalk for 3-D Medical Imaging," *Sensors* 13:9624-9634, 2013.

* cited by examiner

PIEZOELECTRIC MICRO-MACHINED ULTRASONIC TRANSDUCER (PMUT) AND METHOD FOR MANUFACTURING THE PMUT

BACKGROUND

The present disclosure relates to a piezoelectric micro-machined ultrasonic transducer (PMUT) and to a method for manufacturing the PMUT.

DESCRIPTION OF THE RELATED ART

As is known, a transducer is a device that converts a variation of a physical quantity into a variation of an electrical quantity (a resistance or a capacitance), or vice versa. Ultrasonic transducers are devices that are well known in the state of the art and are widely used in the sectors of non-destructive testing (NDT), detection of velocity, industrial automation, object recognition, anticrash systems, and medical imaging. Micro-machined ultrasonic transducers (MUTs) are provided with a vibrating membrane structure, having an appropriate acoustic impedance for guaranteeing a good coupling with a physical medium of interest, for example air or liquids. Vibration of the membrane, under the control of an actuator coupled thereto, causes emission of an ultrasound beam in the medium considered (operation as transmitter). Conversely, reception of an ultrasound signal induces in the membrane a vibration that is transduced into an electrical signal, and thus detected (operation as receiver).

MUTs may be divided into two main types, on the basis of the actuation mechanism: capacitive MUTs (CMUTs) and piezoelectric MUTs (PMUTs). In particular, PMUTs of a known type are manufactured according to a process of etching from the back of a semiconductor substrate so as to define a suspended membrane, extending over which are the piezoelectric actuators/detectors.

Techniques of formation of the membrane from the front of the substrate are possible, but these require opening of holes to form a cavity inside the substrate, and subsequent hermetic closing of said holes (this operation being important above all in the case of MUTs operating in direct contact with liquids).

Specific embodiments moreover envisage formation of regions of the membrane having different stiffnesses, and in particular a lower stiffness in edge regions of the membrane, in order to obtain, in use, a piston-like movement, which affords considerable advantages. Known techniques for reducing the stiffness of the edge region of the membrane include forming through holes in said edge regions, which are then plugged with polymeric material. See, for example, Tao Wang et al., "A Piezoelectric Micro-machined Ultrasonic Transducer Using Piston-Like Membrane Motion", IEEE ELECTRON DEVICE LETTERS, Vol. 36, No. 9, September 2015. This embodiment is, however, not optimal, in so far as the presence of the filling polymeric material may affect the performance of the transducer, for example modifying the frequency of vibration of the membrane.

Further known techniques include forming a thin membrane and then increasing the thickness of the membrane selectively in a central region thereof by applying a mass, so as to obtain a final membrane having a variable thickness along its cross-section. See, for example, Yongli Huang et al., "Capacitive Micro-machined Ultrasonic Transducers with Piston-Shaped Membranes: Fabrication and Experimental Characterization", IEEE Transactions on Ultrasonics, Ferroelectrics, and Frequency Control, Vol. 56, No. 1, January 2009. Also in this case, the presence of the central mass may cause an undesired variation of the resonance frequency and increases the acoustic impedance. Moreover, the manufacturing method is complicated.

BRIEF SUMMARY

According to the present disclosure, a piezoelectric micro-machined ultrasonic transducer (PMUT) and a method for manufacturing the PMUT are provided.

BRIEF DESCRIPTION OF THE SEVERAL VIEWS OF THE DRAWINGS

For an understanding of the present disclosure preferred embodiments thereof are now described, purely by way of non-limiting example, with reference to the attached drawings, wherein:

FIGS. 4, 5A, and 5B-13 show steps for manufacturing the PMUT of FIG. 1;

DETAILED DESCRIPTION

Figure 1:
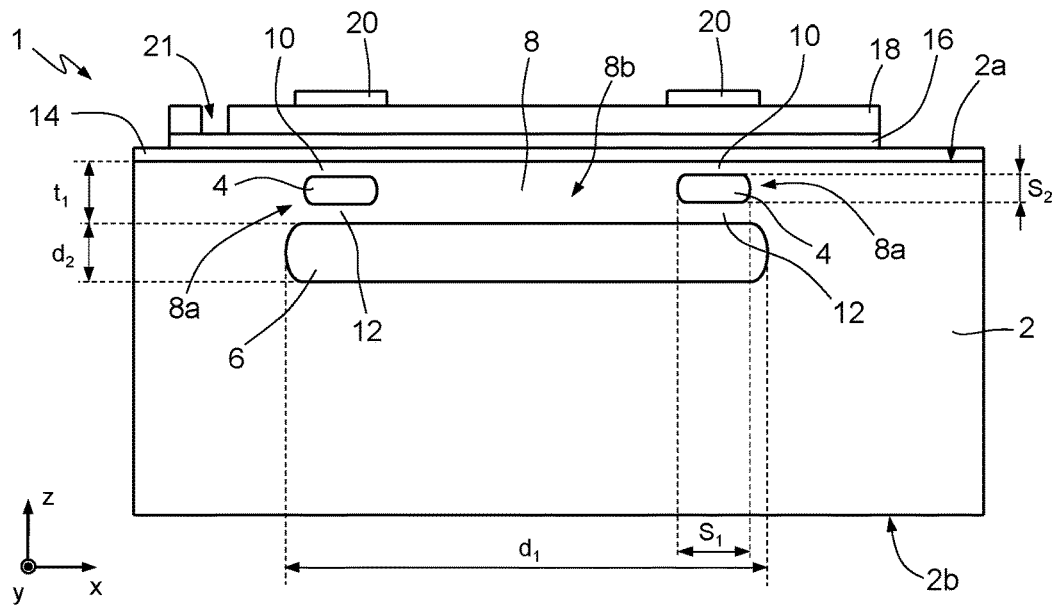
FIG. 1 shows, in view in lateral section taken along the line of section I-I of FIG. 2, a PMUT according to one embodiment of the present disclosure.

FIG. 1 shows a lateral sectional view of a PMUT 1, according to one aspect of the present disclosure.

Figure 2:
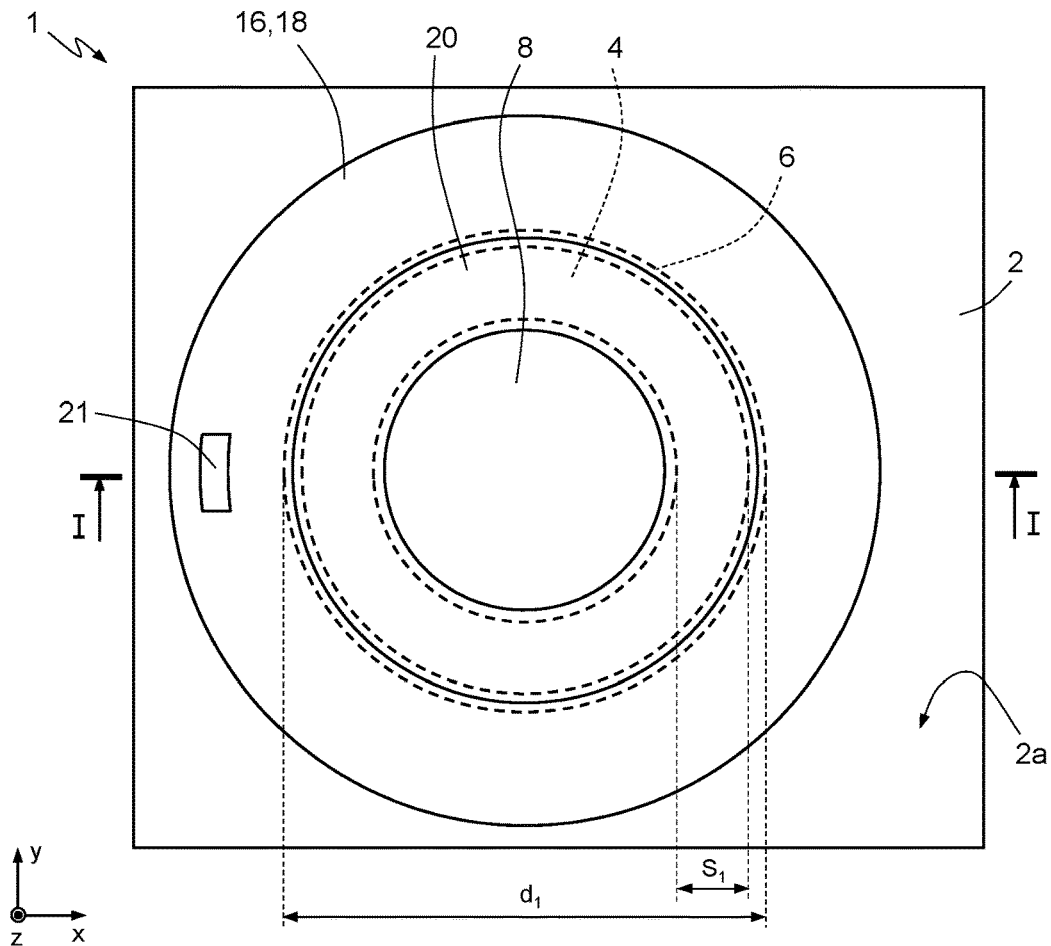
FIG. 2 shows, in top plan view, the PMUT of FIG. 1.

The cross-section of FIG. 1 is represented in a system of Cartesian axes X, Y, and Z, orthogonal to one another, and is taken along a line of section I-I shown in FIG. 2. The PMUT 1 comprises a semiconductor body 2, including a substrate of semiconductor material such as silicon, and one or more epitaxial regions, which are also of semiconductor material such as silicon, grown on the substrate. The semiconductor body 2 has a first face 2a and a second face 2b, opposite to one another along the axis Z. A buried cavity 6, of a shape that, by way of example, is circular in the plane XY, extends within the semiconductor body 2, separated from the first face 2a by a membrane 8 at least in part suspended over the cavity 6. Also the membrane 8 has, in this embodiment described by way of example, a circular shape in the plane XY.

The membrane 8 houses a cavity 4, which extends in peripheral regions 8a of the membrane 8, surrounding a central region 8b of the membrane 8. In top plan view, in the plane XY, the cavity 4 has the shape of a cylindrical annulus, or ring, and delimits internally a central region 8b of the membrane 8 having a stiffness higher than the stiffness of the peripheral regions 8a that house the cavity 4.

Since the cavity 4 extends in the proximity of regions for mechanical coupling of the membrane 8 to the semiconductor body 2, it reduces the stiffness of the peripheral regions 8a of the membrane 8.

It is evident that there are various possibilities of arrangement of the cavity 4. For example, the cavity 4 may extend substantially aligned to the outer edge of the cavity 6. In this case, when observed in the plane XY, the cavity 4 has a maximum diameter substantially equal to the diameter of the cavity 6 (and thus substantially equal to the diameter of the membrane 8). Alternatively, the cavity 4 may extend at a distance from the outer edge of the cavity 6 that is, for example, of a few micrometers. In this case, when observed in the plane XY, the cavity 4 has a maximum diameter smaller than the diameter of the cavity 6 (and thus smaller than the diameter of the membrane 8).

In greater detail, as may be seen from FIG. 1, the cavity 4 is separated from the cavity 6 by a first coupling region 10 and from the first face 2a by a second coupling region 12. The first and second coupling regions 10, 12 support the central region 8b of the membrane 8 and, in use, undergo deflection in the direction Z enabling a piston-like movement of the central region 8b, which also moves in the direction Z. In resting conditions, the first and second coupling regions 10, 12 are substantially parallel to one another and lie parallel to the plane XY.

It should be noted that the first and second coupling regions 10, 12 are integral parts of the membrane 8 and form a connection bridge between the central region 8b of the membrane 8 and the bulk of the semiconductor body 2. The peripheral regions 8a (and thus the first and second coupling regions 10, 12) and the central region 8b of the membrane 8 are made of a single piece with the remaining portions of the semiconductor body 2 (thus forming a monolithic block).

The thickness, along Z, of the first and second coupling regions 10, 12 is comprised between 1 μm and 4 μm, and is in any case chosen as a function of operating specifications, for example the desired frequency of oscillation, the acoustic impedance, and the gain.

In a non-limiting embodiment, the cavity 6 has a diameter $d_1$ comprised between 50 μm and 800 μm, and a maximum thickness $d_2$, along Z, comprised between 2 μm and 5 μm. The cavity 4 has a cross-section that may be quadrangular, or else oval, or circular, or generically polygonal or curvilinear. By way of example, the cavity 4 has a maximum extension $s_1$, in the plane XY, that is chosen so as to satisfy the aforementioned operating specifications, and in particular so that $s_1$ is smaller than $d_1/2$ and $s_2$ (extension orthogonal to the plane XY) is of a few micrometers, for example between 2 μm and 4 μm. The membrane 8 has thickness $t_1$, in the central region 8b, of a few micrometers, for example comprised between 4 and 12 μm. The thickness $t_1$ of the membrane 8, as well as the extension $d_1$ of the cavity 6, are chosen as a function of the desired vibrational frequencies, in a per se known manner, and do not form the subject of the present disclosure.

In a per se known manner, extending over the first face 2a of the semiconductor body, in an area corresponding to the membrane 8, are an interface layer 14 (made, for example, of silicon oxide) and, on the latter, a stack formed by a bottom electrode 16, a piezoelectric 18 (for example, PZT or AlN), and a top electrode 20. The interface layer 14 has the function of electrical insulation between the bottom electrode 16 and the semiconductor body 2 and has moreover the function of generating a compressive stress, at the membrane 8, that opposes possible collapse of the membrane 8 towards the inside of the cavity 6 on account of an excessive difference in pressure between the pressure inside the cavity 6 and the environmental pressure external thereto.

In one embodiment, the bottom electrode 16 and the piezoelectric 18 have, in a view in the plane XY, a circular shape with respective diameters equal to or greater than the diameter $d_1$ of the cavity 6. The piezoelectric 18 moreover has a through opening 21 through which a surface portion of the bottom electrode 16 is exposed to enable subsequent electrical contact of the latter. The top electrode 20 has a circular doughnut shape and extends in a position corresponding to the cavity 4 or, rather, to the first and second coupling regions 10, 12. In use, when an a.c. current/voltage is supplied to the top electrode 20 and bottom electrode 16 in order to activate the piezoelectric 18, a deflection of the membrane 8 is generated in the peripheral regions 8a, which in turn drives the central portion 8b in motion along Z.

In an alternative embodiment, not illustrated, the top electrode extends at the central portion 8b of the membrane 8.

Irrespective of the specific embodiment, the PMUT 1 may function both as transmitter and as receiver. As transmitter, the electrical field between the top electrode 20 and the bottom electrode 16 generates a transverse stress in the piezoelectric 18 on account of the inverse piezoelectric effect. The stress thus generated causes a bending moment that forces the membrane to deflect out of the plane XY, generating a variation of pressure of the environment in which the PMUT 1 is installed, which propagates as pressure wave in the medium considered. As receiver, an incident pressure wave causes a deflection of the membrane and creates a transverse stress that results in a variation of electrical charge between the top electrode and the bottom electrode, owing to the piezoelectric effect.

FIGS. 1 and 2 illustrate by way of example a single PMUT 1. However, in order to emit an ultrasound wave with specific directivity and distance of propagation, it is possible to provide an emitter device including a two-dimensional or linear array of PMUTs 1 arranged according to a specific pattern, for example a circular or a linear pattern as described by Kaoru Yamashita et al. in "Arrayed ultrasonic microsensors with high directivity for in-air use using PZT thin film on silicon diaphragms", Sensors and Actuators, TO 97-98 (2002), p. 302-307. In this case, each PMUT 1 of the array is obtained according to what has been illustrated previously and thus includes a cavity 6 that enables free movement of the membrane 8 along Z and a cavity 4, formed in the membrane 8, which makes it possible to modify the stiffness of peripheral regions 8a of the membrane 8 itself (i.e., rendering the peripheral regions 8a less stiff than the central region 8b), to favor deflection thereof according to a piston-like movement.

Figure 3:
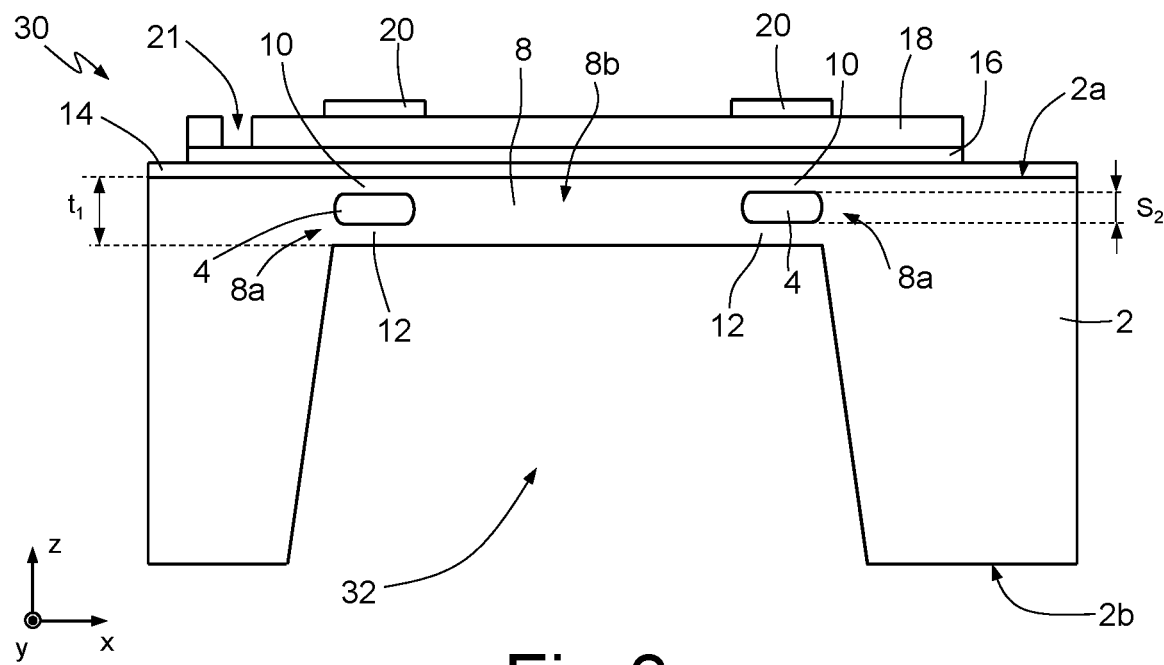
FIG. 3 shows, in lateral sectional view, a PMUT according to a further embodiment of the present disclosure.

FIG. 3 illustrates a PMUT 30 according to an embodiment alternative to that of FIG. 1. In this case (elements that are in common are designated by the same reference numbers and are not described any further), the cavity 6 of a buried type is not present and is, instead, replaced by a cavity 32 that extends through the semiconductor body 2 starting from the second face 2b. In this embodiment, the cavity 32 is at the same pressure as that of the environment in which the PMUT is arranged in use. Any drawbacks due to possible collapse of the membrane 8 on account of an excessive difference in pressure between the pressure inside the cavity 6 and the external environmental pressure are thus overcome.

Described in what follows is a method for manufacturing the PMUT 1 of FIGS. 1 and 2.

Figure 4:
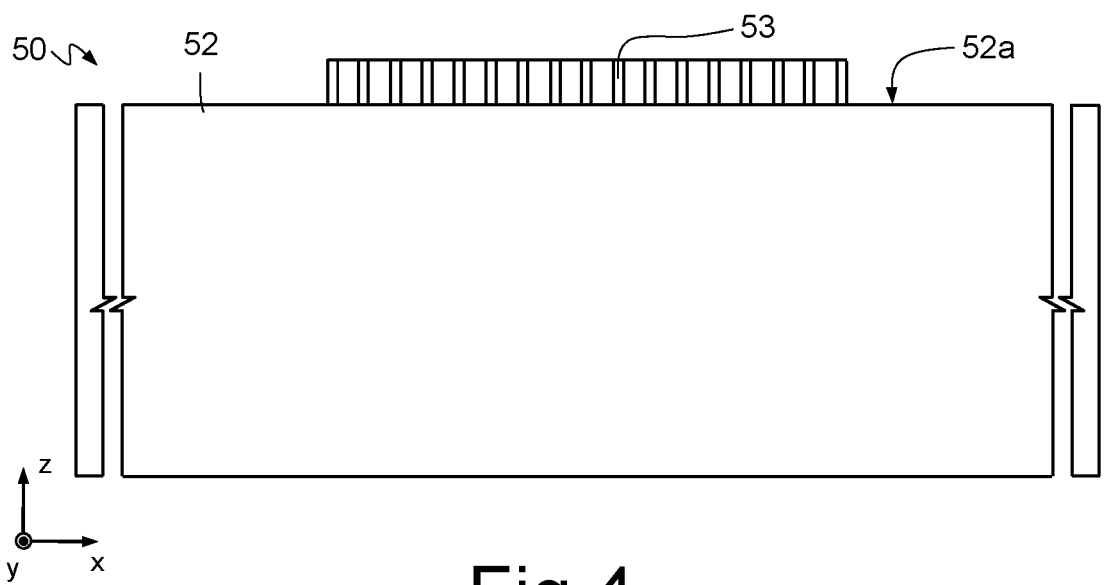

FIG. 4 is a cross-sectional view of a semiconductor wafer 50, made, in particular, of monocrystalline silicon, during an initial step of production of the PMUT 1. On the wafer 50 there may be provided just one PMUT or else a plurality of PMUTs, according to the same manufacturing steps.

Figure 5A:
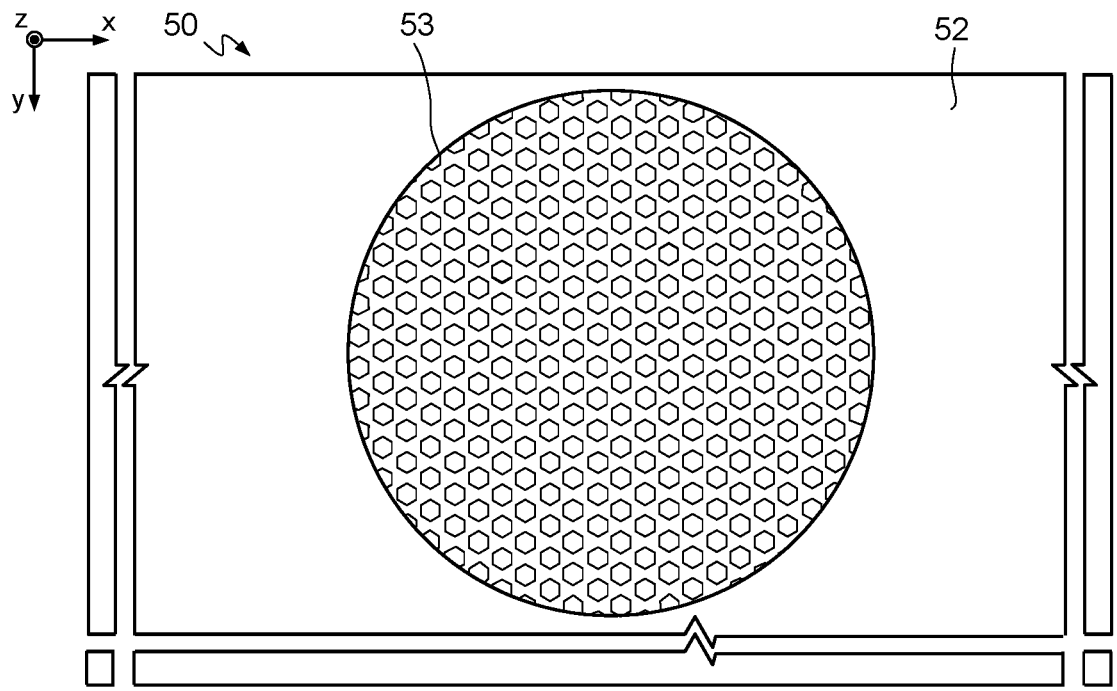

With reference to FIG. 4 (in lateral sectional view) and to FIG. 5A (in top plan view), the wafer 50 comprises a semiconductor body 52 (e.g., a substrate, possibly previously machined according to the need), here of silicon. By a photolithographic step, provided over a top surface 52a of the semiconductor body 52 is a photoresist mask 53. The mask 53 is formed in a region of the semiconductor body 52 in which the cavity 6 is to be formed.

Figure 5B:
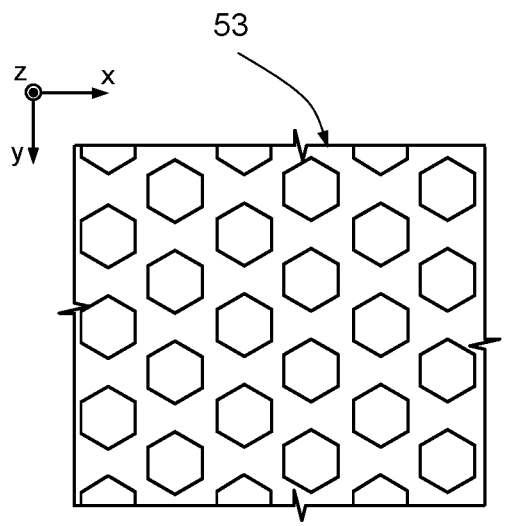

The mask 53 defines a honeycomb lattice (as on the other hand may be more clearly noted from the enlarged portion of FIG. 5B), having mask regions, for example of a hexagonal shape, close together.

Figure 6:
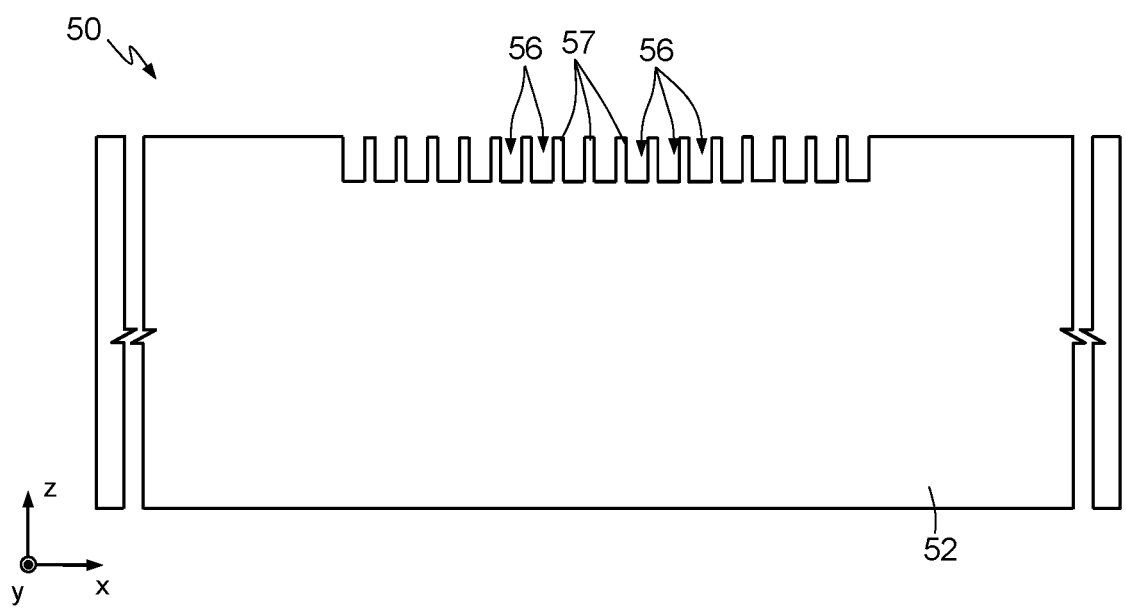

Using the mask 53, FIG. 6, an etch of the semiconductor body 52 is carried out to form trenches 56 having a depth of a few micrometers, for example, comprised between 4 and 14 µm. The trenches 56 define silicon columns 57 that are substantially the same as one another and have a shape corresponding to the shape of the honeycomb regions defined by the mask 53. By way of example, each column 57 has a diameter of approximately 1 µm and is separated from an adjacent column, along X or along Y, by approximately 1 µm. In general, the diameter and spacing of the columns 57 are chosen of values such as to enable closing of the trenches 56 at the top during the step of epitaxial growth described hereinafter.

Figure 7:
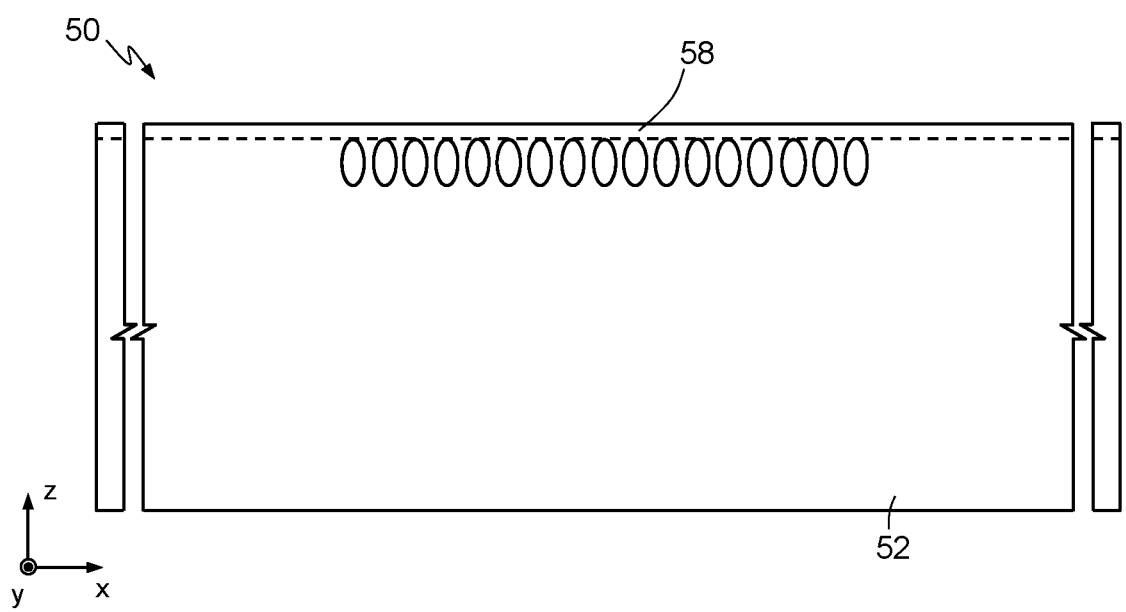

As shown in FIG. 7, the mask 53 is removed, and an epitaxial growth is carried out in deoxidizing environment (typically, in an atmosphere having a high hydrogen concentration, preferably using trichlorosilane—SiHCl$_3$). The epitaxial growth is carried out at least until the trenches 56 are closed at the top (for example, for 45 s at a temperature close to 1200° C.).

Consequently, an epitaxial layer 58 (hereinafter not distinguished from the semiconductor body 52, and designated by the same reference number 52), grows over the silicon columns 57, closes the trenches 56 at the top, and traps therein the gas present (here, hydrogen molecules H$_2$).

Figure 8:
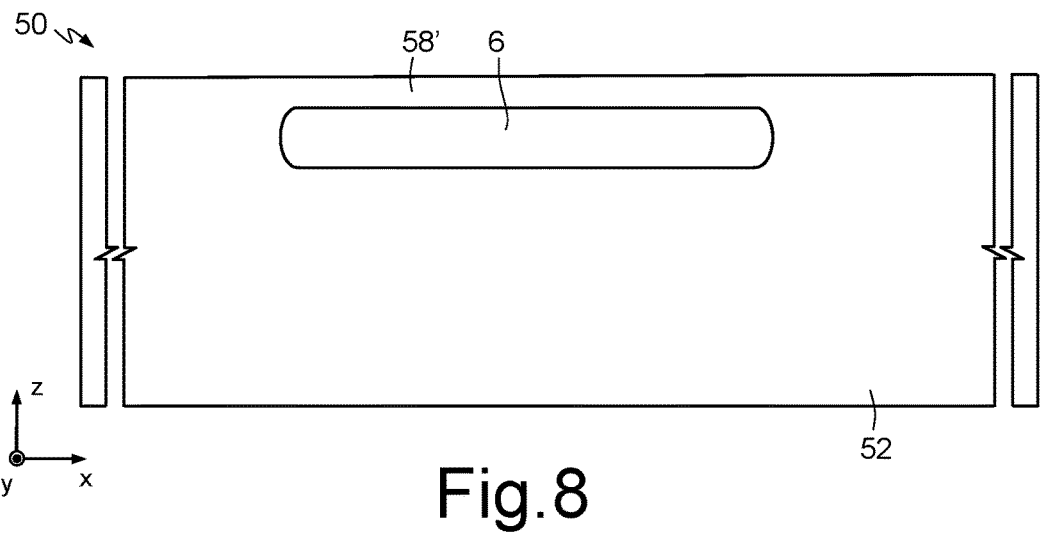

An annealing step is then carried out, for example for approximately 30-40 min at a temperature of approximately 1190-1200° C. The annealing step causes (FIG. 8) a migration of the silicon atoms, which tend to move into the position of lower energy, in a per se known manner, as for example discussed in the paper by T. Sato, N. Aoki, I. Mizushima, and Y. Tsunashima, "A New Substrate Engineering for the Formation of Empty Space in Silicon (ESS) Induced by Silicon Surface Migration", IEDM 1999, pp. 517-520.

At the trenches 56, where the silicon columns are close together, the silicon atoms migrate completely and form the cavity 6, closed at the top by a suspended layer 58'.

Preferably, annealing is carried out in an H$_2$ atmosphere so as to prevent the hydrogen present in the trenches 56 from escaping outwards through the epitaxial layer and so as to increase the hydrogen concentration present in the cavity 6 in the case where the hydrogen trapped during the step of epitaxial growth were not sufficient. Alternatively, annealing may be carried out in nitrogen environment.

Figure 9:
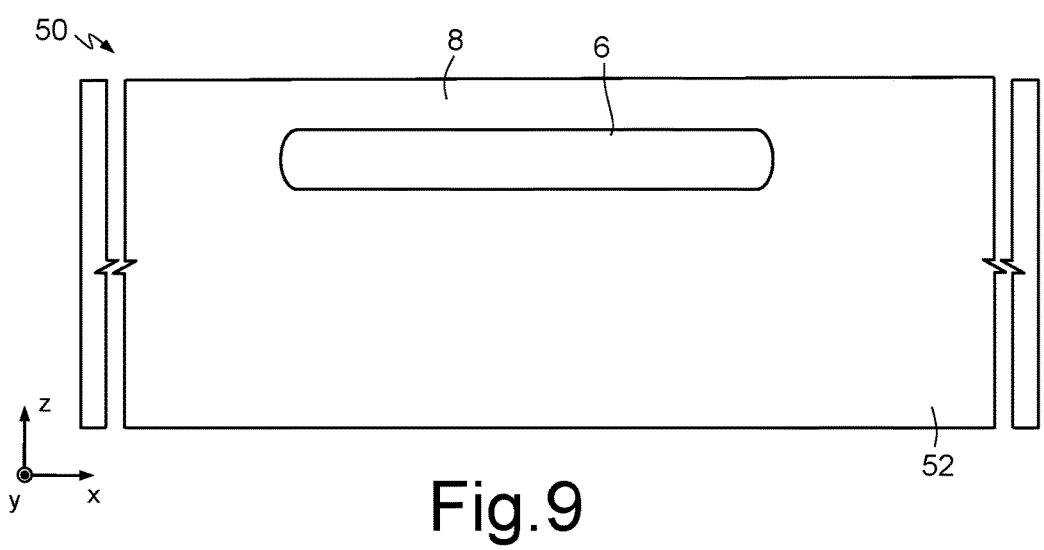

With reference to FIG. 9, in the case where the thickness of the suspended layer 58' were not the thickness $t_1$ desired for the membrane 8 (but were, instead, smaller than $t_1$), a step of epitaxial growth is carried out to reach the desired thickness $t_1$.

Formation of the cavity 4 is carried out. The cavity 4 is formed in a way similar to what has already been described with reference to formation of the cavity 6.

Figure 10:
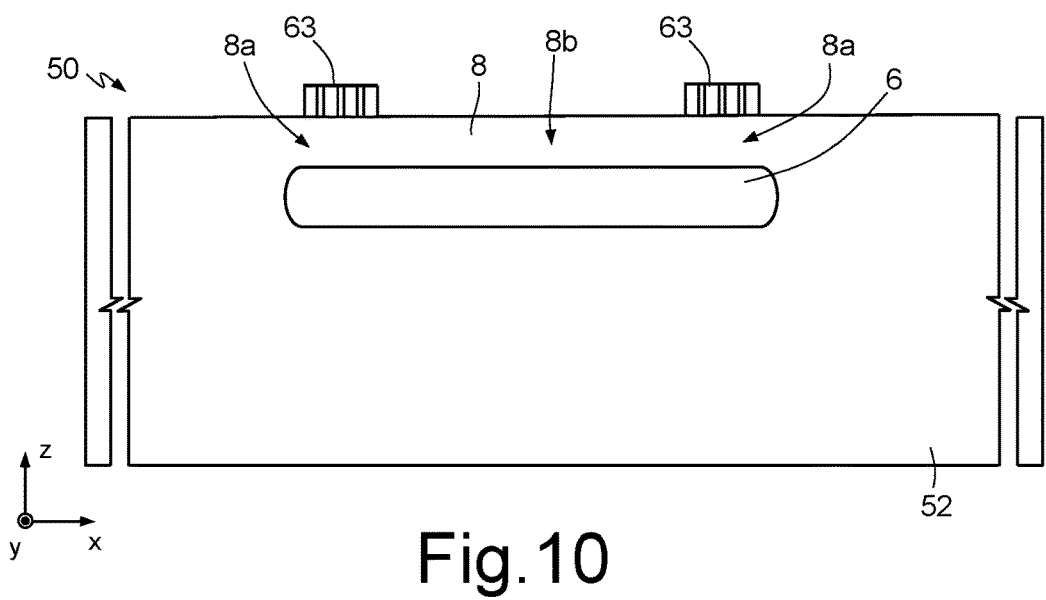

With reference to FIG. 10, provided over the semiconductor body 52, in the region where the cavity 4 is to be formed, is a photoresist mask 63. The mask 63 has, in particular, a circular shape and extends at lateral edge regions of the cavity 6.

The mask 63 defines, in a way similar to what has been described with reference to the mask 53, a honeycomb lattice (see again FIG. 5B), having mask regions of a for example hexagonal shape arranged close together.

Using the mask 63 (FIG. 11), an etch of the semiconductor body 52 is carried out to form trenches 66 having a depth of a few micrometers (in any case, smaller than the total thickness of the membrane 8). The trenches 66 define silicon columns 67 that are substantially the same as one another and have a shape corresponding to the shape of the honeycomb regions defined by the mask 63. By way of example, each column 67 has a diameter of approximately 0.5-1 µm and is separated from an adjacent column, along X or along Y, by approximately 0.5-1 µm.

Figure 12:
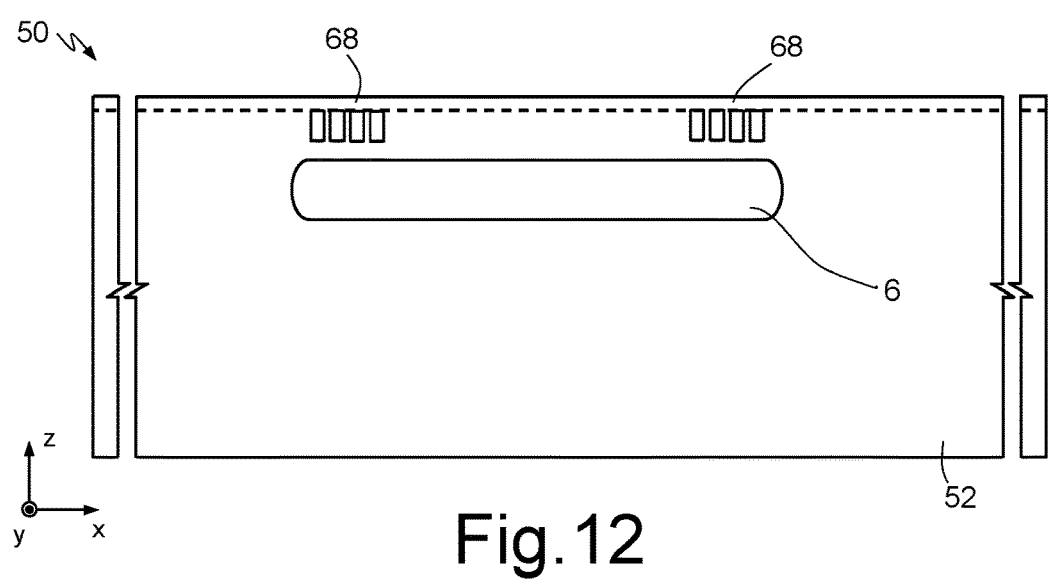

As shown in FIG. 12, the mask 63 is removed and an epitaxial growth is carried out in deoxidizing environment (typically, in atmosphere having a high hydrogen concentration, preferably using trichlorosilane—SiHCl$_3$). The epitaxial growth is carried out at least until the trenches 66 are closed at the top.

Consequently, an epitaxial layer 68 (hereinafter not distinguished from the semiconductor body 52, and designated by the same reference number 52), grows over the silicon columns 67 and closes the trenches 66 at the top, trapping the gas present therein (here, hydrogen molecules H$_2$).

Figure 13:
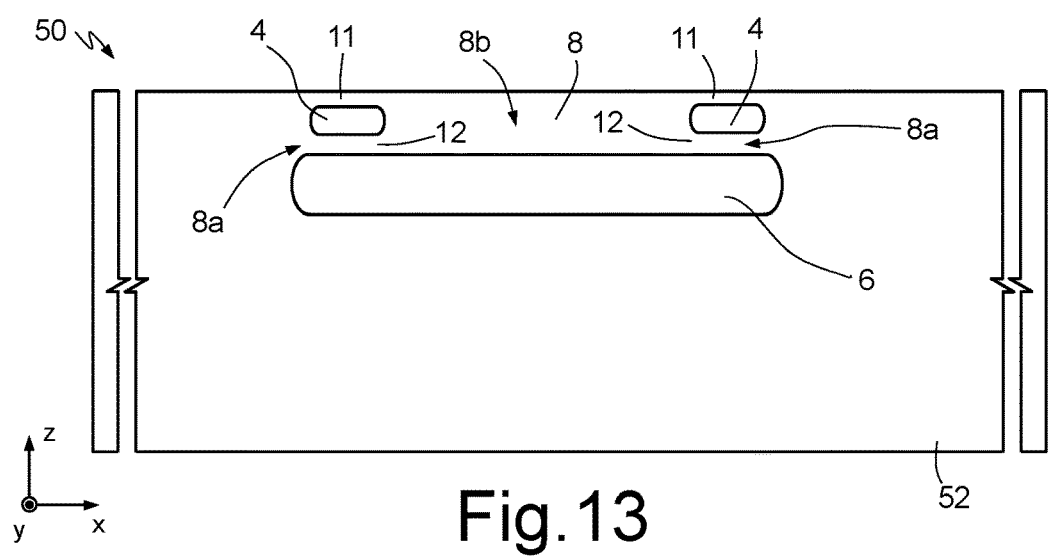

An annealing step is carried out, for example for approximately 30-40 min at a temperature of approximately 1190-1200° C. The annealing step causes (FIG. 13) a migration of the silicon atoms, which tend to move into the position of lower energy, as already mentioned previously with reference to formation of the cavity 6. At the trenches 66, where the silicon columns are close together, the silicon atoms migrate completely and form the buried cavity 4.

Preferably, annealing is carried out in H$_2$ atmosphere so as to prevent the hydrogen present in the trenches 66 from escaping outwards through the epitaxial layer and so as to increase the concentration of hydrogen present in the cavity 6 in the case where the hydrogen trapped during the step of epitaxial growth were not sufficient. Alternatively, annealing may be carried out in nitrogen environment.

The membrane 8 is thus formed, provided with flexible coupling regions 10, 12, and with the central region 8b, which is massive and rigid.

Steps, in themselves known, are carried out for formation of the bottom electrode 16, of the piezoelectric 18, and of the top electrode 20.

For this purpose, a layer of silicon oxide is grown or deposited having a thickness of, for example, 0.6 µm, which forms the interface layer 14 of FIG. 1. A layer of conductive material, for example of platinum, with a thickness of, for example, 0.2 µm, is deposited and defined photolithographically to form the bottom electrode 16. The piezoelectric layer 18 (here of PZT or AlN) is formed (e.g., by the sol-gel technique), with a thickness of, for example, 2 µm. Finally, a layer of conductive material, for example platinum, with a thickness of for example 0.2 µm, is deposited and defined photolithographically to form the top electrode 20. Further steps, not shown in detail, envisage formation of the electrical contacts (of metal) of the bottom and top electrodes 16, 20. In the wafer 50 one or more PMUTs 1 of the type shown in FIG. 1 are thus formed.

Production of the PMUT 30 of FIG. 3 envisages steps similar to those described with reference to FIGS. 10-13 for formation of the cavity 4. However, the cavity 6 is formed in a different way, i.e., by an etch from the back of the semiconductor body 52 to remove selective portions of the semiconductor body 52 and form the cavity 32. The etch from the back of the semiconductor body 52 is, for example, carried out after the steps of formation of the cavity 4, i.e., after the step of FIG. 13.

An etch-stop layer, made for example of silicon oxide, is provided in order to control precisely the etching depth (for this purpose, a substrate of a SOI—Silicon On Insulator—type may be used).

Figure 14:
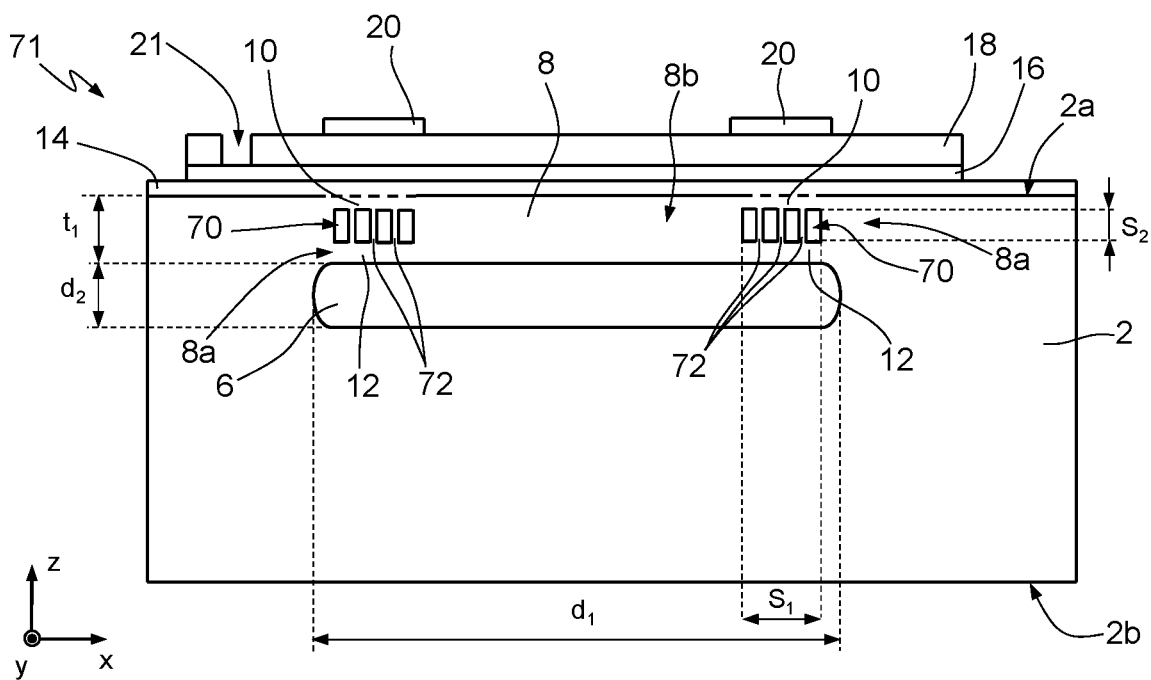
FIG. 14 shows, in lateral sectional view, a PMUT according to a further embodiment of the present disclosure.

According to a further embodiment of a PMUT 71, illustrated in FIG. 14, the cavity 4 is replaced by a labyrinthine cavity 70 having a plurality of columns 72 that extend buried in the peripheral regions 8a of the membrane 8. The labyrinthine cavity 70 develops following a pattern that basically reproduces the ring or annular shape already described with reference to the cavity 4.

Figure 11:
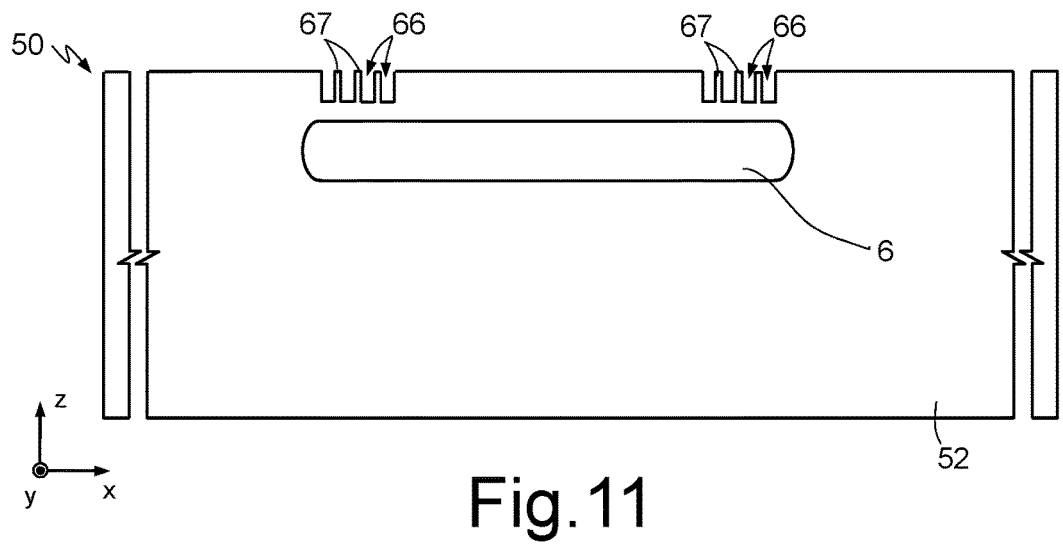

The labyrinthine cavity 70 is formed according to the same process described for formation of the cavity 4 but, in this case, the columns 67 described with reference to FIG. 11 are spaced at a greater distance apart from one another so that migration of the silicon atoms causes thinning of the columns 67 and not disappearance thereof so that they form in effect buried pillars.

In this embodiment, the pillars present in the labyrinthine cavity 70 represent a structural reinforcement of the respective region of the membrane 8 as compared to the embodiment of FIG. 1, in which the cavity 4 is completely hollow, albeit reducing the stiffness of the peripheral regions 8a.

Figure 15:
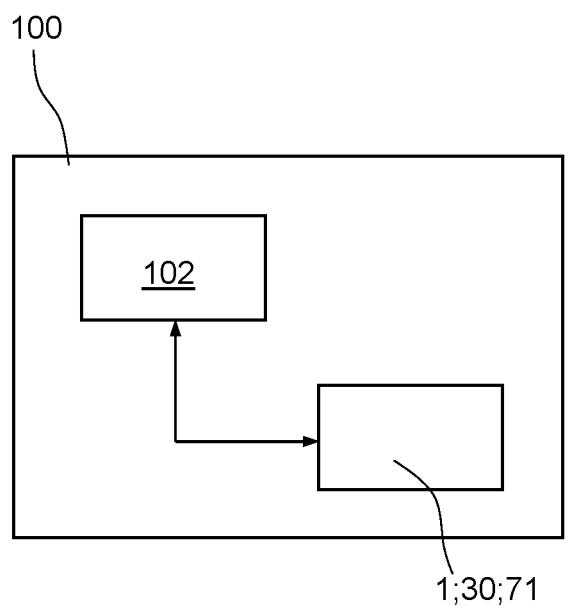
FIG. 15 is a schematic illustration of an electronic system including one or more PMUTs according to any one of the embodiments of FIGS. 1-3 and 14.

FIG. 15 is a schematic illustration of an electronic system 100 including one or more PMUTs according to any one of the embodiments described previously. In greater detail, the electronic system 100 includes an array of PMUTs, for example arranged according to a circular pattern and electrically connected together in parallel. Simultaneous actuation of the PMUTs of the array generates a pressure wave emitted having own characteristics of directivity, in a per se known manner and not forming the subject of the present disclosure. The electronic system 100 further includes a control unit 102 for controlling the array of PMUTs, configured to bias, in an operating condition in which the array of PMUTs functions as transmitter, the bottom and top electrodes 16, 20 of each PMUT of the array in order to cause a deflection of the respective piezoelectric 18 and, consequently, a controlled deflection of the membrane 8. The control unit 102 of the array of PMUTs is moreover configured to receive and process, in an operating condition in which the array of PMUTs functions as receiver, an electrical signal transduced by the piezoelectric 18 that is a function of a deflection of the membrane 8 caused by a pressure wave that impinges on the membrane 8 of the PMUT.

It is evident that, according to the operating context and the specifications of application, the electronic system 100 (and in particular the control unit 102) may be configured to operate in just one of the two aforementioned operating modes.

The electronic system 100 is, for example, one from among: a non-destructive testing system, a velocity-detection system, an object-recognition system, an anticrash system, or a medical-imaging system.

The advantages that may be achieved by the PMUT according to the present disclosure, in the respective embodiments and according to the respective manufacturing methods, are evident from what has been described previously.

In particular, the devices provided according to the present disclosure do not have through holes in the membrane, thus simplifying the manufacturing process and optimizing the response of the membrane to vibration. Moreover, the embodiments of FIGS. 1 and 14 do not require machining from the back of the semiconductor body, thus simplifying handling of the wafer and increasing the production yield.

The structure described enables a piston-like actuation, which proves optimal for generation of a wave with high pressure. This advantage is obtained by formation of a rigid mass at the center of the membrane and of flexible portions, i.e., with lower stiffness, at the outer edges of the membrane. The membrane thus formed is, in one embodiment, made of a single piece of one and the same semiconductor material.

The repeatability of the process described is very high and makes it possible to obtain devices having a resonance frequency that is minimally affected by spread deriving from the manufacturing process.

Finally, thanks to the manufacturing process described, the silicon PMUT has a low cost (for example, the embodiments of FIGS. 1 and 14 do not require the use of the costly SOI substrate) and contained dimensions.

Finally, it is clear that numerous modifications and variations may be made to the device described and illustrated herein, all of which fall within the scope of the inventive idea.

For example, the cavity 4 may be replaced by a plurality of similar buried cavities in the form of concentric rings.

Alternatively, the cavity 4 may be replaced by a plurality of buried sub-cavities extending at a distance from one another and arranged following a predetermined pattern, for example a circular annulus.

Finally, it is evident that the shape of the cavity 4 may be different from the shape of a circular annulus described previously. It may have a shape chosen according to the need, for example that of an oval annulus, or an asymmetrical or a generically polygonal shape.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A piezoelectric micro-machined ultrasonic transducer (PMUT), comprising:
    a semiconductor body having a first cavity and a membrane suspended over the first cavity, the membrane having a peripheral region that extends around a central region;
    a piezoelectric transducer assembly at least partially on the membrane, the piezoelectric transducer assembly being configured to be actuated for generating a deflection of the membrane; and
    a second cavity buried in the peripheral region of the membrane and delimiting the central region of the membrane.

2. The PMUT according to claim 1, wherein the peripheral portion has a first stiffness and the central region has a second stiffness, the first stiffness being lower than the second stiffness.

3. The PMUT according to claim 1, wherein the second cavity extends along an entire perimeter of the membrane between the first cavity and the piezoelectric transducer assembly.

4. The PMUT according to claim 3, wherein the membrane region that extends between the second cavity and the first cavity forms a first flexible portion of the membrane, and the membrane region that extends between the second cavity and the transducer assembly forms a second flexible portion of the membrane, the piezoelectric transducer assembly being configured to generate a deflection of the first and second flexible portions.

5. The PMUT according to claim 4, wherein the central region of the membrane has a thickness between 4 µm and 12 µm; the first flexible portion has a thickness between 1 µm and 4 µm; and the second flexible portion has a thickness between 1 µm and 4 µm.

6. The PMUT according to claim 1, wherein the second cavity is empty.

7. The PMUT according to claim 1, comprising a plurality of pillars located in the second cavity to form a labyrinthine cavity.

8. The PMUT according to claim 1, wherein the first cavity is a sealed cavity that is buried in the semiconductor body.

9. The PMUT according to claim 1, wherein the first cavity is an open trench that extends from a side of the semiconductor body.

10. The PMUT according to claim 1, wherein the piezoelectric transducer assembly includes:
a bottom electrode on the membrane;
a piezoelectric on the bottom electrode; and
a top electrode on the piezoelectric,
wherein the top electrode extends selectively overlying the buried region.

11. An electronic system comprising:
an array of piezoelectric micro-machined ultrasonic transducers (PMUTs), each PMUT including:
a semiconductor body having a first cavity and a membrane suspended over the first cavity, the membrane having a peripheral region that extends around a central region;
a second cavity in the peripheral region of the membrane, the second cavity being a buried cavity; and
a piezoelectric transducer assembly on the membrane, the piezoelectric transducer assembly being configured to cause a deflection of the membrane.

12. The electronic system according to claim 11, wherein the electronic system is one from among: a non-destructive testing system, a velocity-detection system, an object-recognition system, an anti-crash system, and a medical-imaging system.

13. The system according to claim 11, comprising a control unit for controlling the array of PMUTs for at least one of:
to cause, in a first operating condition, a deflection of the membrane such as to generate emission of a pressure wave; and
to acquire, in a second operating condition, a signal transduced by the piezoelectric transducer assembly as a function of a deflection of the membrane generated by a pressure wave received.

14. A method comprising:
forming a piezoelectric micro-machined ultrasonic transducer, wherein the forming includes:
forming, in a semiconductor body at a first side, a first cavity and a membrane suspended over the first cavity;
forming a second cavity in a peripheral region of the membrane, the second cavity being a buried cavity and delimiting a central region of the membrane; and
forming, at least in part on the membrane, a piezoelectric transducer assembly configured to generate a deflection of the membrane.

15. The method according to claim 14, wherein forming the second cavity includes generating a stiffness of the peripheral region that is lower than a stiffness of the central region.

16. The method according to claim 15, wherein forming the second cavity comprises forming the second cavity between the first cavity and the piezoelectric transducer assembly along an entire perimeter of the membrane.

17. The method according to claim 16, wherein forming the second cavity further comprises:
forming a first flexible portion of the membrane between the second cavity and the first cavity; and
forming a second flexible portion of the membrane between the second cavity and the piezoelectric transducer assembly.

18. The method according to claim 14, wherein forming the second cavity includes forming a hollow sealed cavity buried in the membrane.

19. The method according to claim 14, wherein forming the second cavity further includes:
etching trenches in the peripheral portion of the membrane, the trenches separated from each other by walls of semiconductor material;
epitaxially growing, starting from the walls, a closing layer of semiconductor material, the closing layer closing the trenches from above; and
carrying out a thermal annealing to cause migration of the semiconductor material of the walls thus forming a sealed cavity buried in the membrane.

20. The method according to claim 14, wherein forming the second cavity further includes forming a plurality of pillars inside the second cavity and thereby forming a labyrinthine cavity.

21. The method according to claim 20, wherein forming the second cavity further includes:
etching trenches in the peripheral portion of the membrane, the trenches separated from each other by walls of semiconductor material;
epitaxially growing, starting from the walls, a closing layer of semiconductor material, the closing layer closing the trenches from above; and
carrying out a thermal treatment to cause migration of part of the semiconductor material of the walls to form the pillars of the labyrinthine cavity.

22. The method according to claim 14, wherein forming the first cavity includes etching a through opening at a second side of the semiconductor material, the second side being opposite to the first side.

23. The method according to claim 14, wherein forming the piezoelectric transducer assembly includes:
depositing and defining a bottom-electrode layer on the membrane;
depositing and defining a layer of piezoelectric material on the bottom electrode; and
depositing and defining a top-electrode layer on the piezoelectric,
wherein depositing and defining the top-electrode layer includes removing selective portions of the top-electrode layer and not removing portions that extend over the buried region.

* * * * *